(12) United States Patent
Mitani et al.

(10) Patent No.: US 8,575,290 B2
(45) Date of Patent: Nov. 5, 2013

(54) SILICONE RESIN COMPOSITION, SILICONE RESIN SHEET, OPTICAL SEMICONDUCTOR ELEMENT DEVICE, AND PRODUCING METHOD OF SILICONE RESIN SHEET

(75) Inventors: Munehisa Mitani, Osaka (JP); Hiroyuki Katayama, Osaka (JP); Haruka Fujii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/469,452

(22) Filed: May 11, 2012

(65) Prior Publication Data
US 2012/0306107 A1    Dec. 6, 2012

(30) Foreign Application Priority Data

Jun. 2, 2011   (JP) ................................. 2011-124490
Jun. 13, 2011  (JP) ................................. 2011-131537

(51) Int. Cl.
*C08G 77/08*    (2006.01)

(52) U.S. Cl.
USPC ................................. 528/15; 528/31; 428/447

(58) Field of Classification Search
USPC ...................................... 528/15, 31; 428/447
See application file for complete search history.

(56) References Cited

U.S. PATENT DOCUMENTS

| 4,558,109 | A | * | 12/1985 | McAfee | .......................... | 528/15 |
| 4,587,137 | A | | 5/1986 | Eckberg | | |
| 7,045,586 | B2 | * | 5/2006 | Ahn et al. | ....................... | 528/26 |
| 2004/0116640 | A1 | | 6/2004 | Miyoshi | | |
| 2007/0092737 | A1 | | 4/2007 | Boardman et al. | | |

FOREIGN PATENT DOCUMENTS

| JP | 2000-198930 A | 7/2000 |
| JP | 2004-186168 A | 7/2004 |
| JP | 2008-150437 A | 7/2008 |
| JP | 2009-84511 A | 4/2009 |

OTHER PUBLICATIONS

European Search Report issued in Application No. 12166783.6 dated Aug. 21, 2012.

* cited by examiner

*Primary Examiner* — Margaret Moore
(74) *Attorney, Agent, or Firm* — Sughrue Mion, PLLC

(57) ABSTRACT

A silicone resin composition contains a first organopolysiloxane having, in one molecule, both at least two ethylenically unsaturated hydrocarbon groups and at least two hydrosilyl groups; a second organopolysiloxane having, in one molecule, at least two hydrosilyl groups without containing an ethylenically unsaturated hydrocarbon group; a hydrosilylation catalyst; and a hydrosilylation inhibitor.

5 Claims, 1 Drawing Sheet

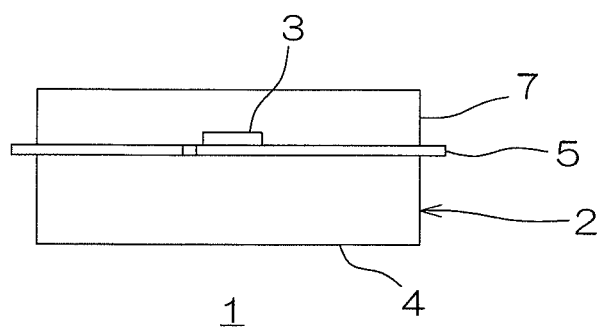

SILICONE RESIN COMPOSITION, SILICONE RESIN SHEET, OPTICAL SEMICONDUCTOR ELEMENT DEVICE, AND PRODUCING METHOD OF SILICONE RESIN SHEET

CROSS-REFERENCE TO RELATED APPLICATION

The present application claims priority from Japanese Patent Applications No. 2011-124490 filed on Jun. 2, 2011 and No. 2011-131537 filed on Jun. 13, 2011, the contents of which are hereby incorporated by reference into this application.

BACKGROUND OF THE INVENTION

1. Field of the Invention

The present invention relates to a silicone resin composition used in encapsulating an optical semiconductor element, a silicone resin sheet obtained by semi-curing the silicone resin composition, an optical semiconductor element device having an encapsulating layer obtained by curing the silicone resin composition, and a producing method of the silicone resin sheet.

2. Description of Related Art

Conventionally, a silicone resin with excellent transparency has been used as an encapsulating material for encapsulating an optical semiconductor element such as a light emitting diode (LED).

As such an encapsulating material, for example, a silicone resin composition containing an organopolysiloxane, which contains an alkenyl group, and an organohydrogenpolysiloxane has been known (ref: for example, Japanese Unexamined Patent Publications No. 2000-198930, No. 2004-186168, and No. 2008-150437).

The silicone resin composition is usually in a liquid state at room temperature, and the alkenyl group in the organopolysiloxane and a hydrosilyl group in the organohydrogenpolysiloxane are subjected to an addition reaction to be cured by heating in the presence of a platinum catalyst.

To encapsulate the optical semiconductor element using the silicone resin composition, for example, a method of filling the silicone resin composition in a housing in which the optical semiconductor element is disposed to be cured has been known.

However, in this method, there may be a case where viscosity of the silicone resin composition in a liquid state changes in accordance with the operating environment, so that it may be difficult to stably fill with the silicone resin composition.

Therefore, for example, a method of fabricating an optical semiconductor encapsulating sheet by heating and drying an encapsulating sheet composition, which contains a silicone resin having a cyclic ether-containing group (to be specific, a glycidyl group, an epoxycyclohexyl group, and an oxetane group) and a thermal curing agent that reacts with the cyclic ether-containing group, and encapsulating an optical semiconductor element using the optical semiconductor encapsulating sheet has been proposed (ref: for example, Japanese Unexamined Patent Publication No. 2009-84511).

SUMMARY OF THE INVENTION

As described in Japanese Unexamined Patent Publication No. 2009-84511 described above, when the optical semiconductor encapsulating sheet is fabricated using the silicone resin composition described in Japanese Unexamined Patent Publications No. 2000-198930, No. 2004-186168, and No. 2008-150437 described above, it has been considered that the addition reaction of the alkenyl group with the hydrosilyl group is controlled, so that the silicone resin composition is brought into a semi-cured state.

However, in that case, it is difficult to control the reaction of the alkenyl group with the hydrosilyl group in the silicone resin composition and therefore, it is difficult to uniformly semi-cure the silicone resin composition.

It is an object of the present invention to provide a silicone resin composition that is capable of being uniformly semi-cured, a silicone resin sheet that is obtained by semi-curing the silicone resin composition, an optical semiconductor element device having an encapsulating layer that is obtained by curing the silicone resin composition, and a producing method of the silicone resin sheet.

A silicone resin composition of the present invention contains a first organopolysiloxane having, in one molecule, both at least two ethylenically unsaturated hydrocarbon groups and at least two hydrosilyl groups; a second organopolysiloxane having, in one molecule, at least two hydrosilyl groups without containing an ethylenically unsaturated hydrocarbon group; a hydrosilylation catalyst; and a hydrosilylation inhibitor.

In the silicone resin composition of the present invention, it is preferable that the hydrosilylation inhibitor contains a quaternary ammonium hydroxide.

A silicone resin sheet of the present invention is obtained by semi-curing the above-described silicone resin composition.

In the silicone resin sheet of the present invention, it is preferable that the thickness of the silicone resin sheet after being pressed at a pressure of 7 g/mm$^2$ is 0.1 to 10% with respect to that before being pressed.

An optical semiconductor element device of the present invention includes an optical semiconductor element and an encapsulating layer encapsulating the optical semiconductor element that is obtained by curing the above-described silicone resin sheet.

A method for producing a silicone resin sheet of the present invention includes the steps of applying the above-described silicone resin composition onto a substrate and heating the silicone resin composition applied on the substrate at 20 to 200° C. for 0.1 to 120 minutes.

According to the silicone resin composition of the present invention, the first organopolysiloxane having, in one molecule, both at least two ethylenically unsaturated hydrocarbon groups and at least two hydrosilyl groups; the second organopolysiloxane having, in one molecule, at least two hydrosilyl groups without containing an ethylenically unsaturated hydrocarbon group; the hydrosilylation catalyst; and the hydrosilylation inhibitor are contained.

Therefore, it is possible to suppress a hydrosilylation reaction of the ethylenically unsaturated hydrocarbon group in the first organopolysiloxane with the hydrosilyl group in the second organopolysiloxane with the hydrosilylation inhibitor and to proceed a condensation reaction of the hydrosilyl group in the first organopolysiloxane with the hydrosilyl group in the second organopolysiloxane.

As a result, the silicone resin composition can be uniformly semi-cured.

BRIEF DESCRIPTION OF THE DRAWINGS

FIG. 1 shows a schematic configuration view of an optical semiconductor element device.

DETAILED DESCRIPTION OF THE INVENTION

A silicone resin composition of the present invention contains, as essential components, a first organopolysiloxane, a second organopolysiloxane, a hydrosilylation catalyst, and a hydrosilylation inhibitor.

The first organopolysiloxane has, in one molecule, both at least two ethylenecally unsaturated hydrocarbon groups and at least two hydrosilyl groups (H—Si≡, ref: formula (1) below). To be specific, the first organopolysiloxane contains an organopolysiloxane containing a hydrogen atom at its end and an ethylenically unsaturated hydrocarbon group in its side chain represented by formula (1) below, an organopolysiloxane containing an ethylenically unsaturated hydrocarbon group at its end and a hydrogen atom in its side chain represented by formula (2) below, or an organopolysiloxane containing a hydrogen atom and an ethylenically unsaturated hydrocarbon gro in its side chain represented by formula (3) below.

Formula (1):

Chemical Formula 1

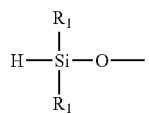   A

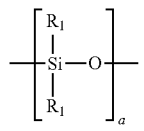   B

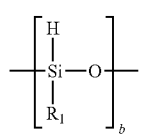   C

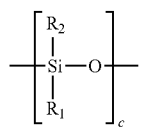   D

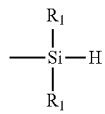   E (where A to E represent a constituent unit, A and E represent an end unit, and B to D represent a repeating unit. $R_1$ represents a monovalent hydrocarbon group selected from a saturated hydrocarbon group and an aromatic hydrocarbon group. $R_2$ represents a monovalent ethylenically unsaturated hydrocarbon group. "a" represents an integer of 0 or 1 or more, "b" represents an integer of 0 or 1 or more, and "c" represents an integer of 2 or more.)

Formula (2):

Chemical Formula 2

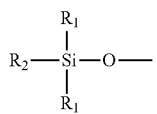   F

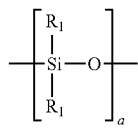   G

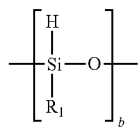   H

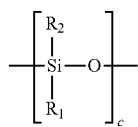   I

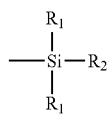   J (where F to J represent a constituent unit, F and J represent an end unit, and G to I represent a repeating unit. $R_1$ represents a monovalent hydrocarbon group selected from a saturated hydrocarbon group and an aromatic hydrocarbon group. $R_2$ represents a monovalent ethylenically unsaturated hydrocarbon group. "a" represents an integer of 0 or 1 or more, "b" represents an integer of 2 or more, and "c" represents an integer of 0 or 1 or more.)

Formula (3):

Chemical Formula 3

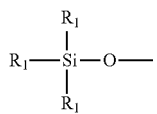   K

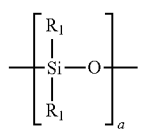   L

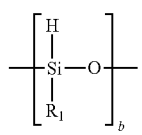   M

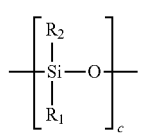   N

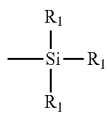

(where K to O represent a constituent unit, K and O represent an end unit, and L to N represent a repeating unit. $R_1$ represents a monovalent hydrocarbon group selected from a saturated hydrocarbon group and an aromatic hydrocarbon group. $R_2$ represents a monovalent ethylenically unsaturated hydrocarbon group. "a" represents an integer of 0 or 1 or more, "b" represents an integer of 2 or more, and "c" represents an integer of 2 or more.)

Examples of the saturated hydrocarbon group include a straight chain or branched chain alkyl group having 1 to 6 carbon atoms (such as a methyl group, an ethyl group, a propyl group, an isopropyl group, a butyl group, an isobutyl group, a pentyl group, and a hexyl group) and a cycloalkyl group having 3 to 6 carbon atoms (such as a cyclopentyl group and a cyclohexyl group).

An example of the aromatic hydrocarbon group includes an aryl group having 6 to 10 carbon atoms (such as a phenyl group and a naphthyl group).

In the above-described formulas (1) to (3), the number of carbon atoms in the monovalent hydrocarbon group represented by $R_1$ is, for example, 1 to 20, or preferably 1 to 10.

In the above-described formulas (1) to (3), $R_1$ may be the same or different from each other. Preferably, $R_1$ is the same.

In the above-described formulas (1) to (3), preferably, in view of transparency, thermal stability, and light resistance, a straight chain alkyl group, more preferably a straight chain alkyl group having 1 to 6 carbon atoms, or particularly preferably a methyl group is used as the monovalent hydrocarbon group represented by $R_1$.

In the above-described formulas (1) to (3), examples of the ethylenically unsaturated hydrocarbon group represented by $R_2$ include a substituted or unsubstituted ethylenically unsaturated hydrocarbon group. Examples thereof include an alkenyl group and a cycloalkenyl group.

An example of the alkenyl group includes an alkenyl group having 2 to 10 carbon atoms such as a vinyl group, a allyl group, a propenyl group, a butenyl group, a pentenyl group, a hexenyl group, a heptenyl group, and an octenyl group.

An example of the cycloalkenyl group includes a cycloalkenyl group having 3 to 10 carbon atoms such as a cyclohexenyl group and a norbornenyl group.

In the above-described formulas (1) to (3), the number of carbon atoms in the ethylenically unsaturated hydrocarbon group represented by $R_2$ is, in view of transparency and heat resistance of the cured product, for example, 2 to 20, or preferably 2 to 10.

In the above-described formulas (1) to (3), $R_2$ may be the same or different from each other. Preferably, $R_2$ is the same.

In the above-described formulas (1) to (3), in view of reactivity with the hydrosilyl group, preferably, an alkenyl group, more preferably an alkenyl group having 2 to 5 carbon atoms, or even more preferably vinyl is used as the ethylenically unsaturated hydrocarbon group represented by $R_2$.

In the above-described formula (1), "a" is, for example, 0 to 10000, or preferably 0 to 1000; "b" is, for example, 0 to 1000, or preferably 0 to 100; and "c" is, for example, 2 to 1000, or preferably 2 to 100.

In the above-described formula (2), "a" is, for example, 0 to 10000, or preferably 1 to 1000; "b" is, for example, 2 to 1000, or preferably 2 to 100; and "c" is, for example, 0 to 1000, or preferably 0 to 100.

In the above-described formula (3), "a" is, for example, 0 to 10000, or preferably 0 to 1000; "b" is, for example, 2 to 1000, or preferably 2 to 100; and "c" is, for example, 2 to 1000, or preferably 2 to 100.

Examples of the first organopolysiloxane include a straight chain structure of vinyl-terminated polymethylhydrosiloxane (corresponding to the above-described formula (2)), vinyl-terminated methylhydrosiloxane-dimethylsiloxane copolymer (corresponding to the above-described formula (2)), vinyl-terminated polyphenyl(dimethylhydroxy)siloxane (corresponding to the above-described formula (2)), vinyl-terminated methylhydrosiloxane-phenylmethylsiloxane copolymer (corresponding to the above-described formula (2)), vinyl-terminated methylhydrosiloxane-octylmethylsiloxane copolymer (corresponding to the above-described formula (2)), hydrogen-terminated vinylmethylsiloxane-dimethylsiloxane copolymer (corresponding to the above-described formula (1)), and hydrogen-terminated polyvinylmethylsiloxane (corresponding to the above-described formula (1)). The molecular structure of the first organopolysiloxane is not limited to the above-described straight chain structure and may be, for example, a cyclic chain structure, a branched chain structure, or a three dimensional network structure.

Of the first organopolysiloxanes, preferably an organopolysiloxane containing a hydrogen atom at its end and an ethylenically unsaturated hydrocarbon group in its side chain represented by the above-described formula (1), or more preferably a hydrogen-terminated vinylmethylsiloxane-dimethylsiloxane copolymer is used.

The first organopolysiloxanes can be used alone (one only) or in combination of two or more.

The content of the ethylenically unsaturated hydrocarbon group (the molarity of the ethylenically unsaturated hydrocarbon group per unit mass) in the first organopolysiloxane is, in view of hardness and flexibility of the cured product, for example, 0.005 to 10 mmol/g, or preferably 0.01 to 5 mmol/g.

When the content of the ethylenically unsaturated hydrocarbon group in the first organopolysiloxane is below 0.005 mmol/g, the hardness of the cured product may be insufficient. When the content of the ethylenically unsaturated hydrocarbon group exceeds 10 mmol/g, the flexibility of the cured product may be insufficient.

The content of the hydrosilyl group (the molarity of the hydrosilyl group per unit mass) in the first organopolysiloxane is, for example, 0.01 to 10 mmol/g, or preferably 0.1 to 5 mmol/g.

The number average molecular weight of the first organopolysiloxane is, for example, 1000 to 100000, or preferably 5000 to 50000.

The viscosity (at 25° C.) of the first organopolysiloxane is, in view of hardness of the cured product, for example, 100 to 500000 mPa·s, or preferably 300 to 100000 mPa·s. The viscosity of the first organopolysiloxane can be measured using a B-type viscometer.

The first organopolysiloxane is blended in 100 parts by mass of a silicone resin composition at a mixing ratio of, for example, 0.1 to 99.9 parts by mass, or preferably 1 to 99 parts by mass.

The second organopolysiloxane has, in one molecule, at least two hydrosilyl groups without containing an ethylenically unsaturated hydrocarbon group. To be specific, the second organopolysiloxane contains an organopolysiloxane containing a hydrogen atom in its side chain represented by formula (4) below or a hydrogen-terminated organopolysiloxane represented by formula (5) below.

Formula (4):

Chemical Formula 4

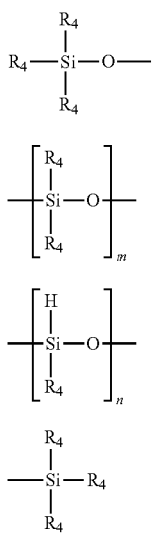

(where P to S represent a constituent unit, P and S represent an end unit, and Q and R represent a repeating unit. $R_4$ represents a monovalent hydrocarbon group selected from a saturated hydrocarbon group and an aromatic hydrocarbon group. "m" represents an integer of 0 or 1 or more and "n" represents an integer of 2 or more.)

Formula (4):
Chemical Formula 4

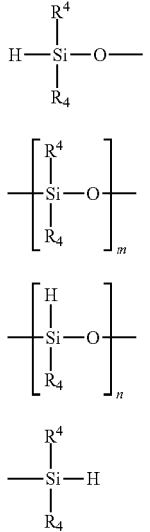

(where T to W represent a constituent unit, T and W represent an end unit, and U and V represent a repeating unit. $R_4$ represents a monovalent hydrocarbon group selected from a saturated hydrocarbon group and an aromatic hydrocarbon group. "m" represents an integer of 0 or 1 or more and "n" represents an integer of 0 or 1 or more.)

In the above-described formulas (4) and (5), examples of the monovalent hydrocarbon group represented by $R_4$ include the same hydrocarbon group as $R_1$ in the first organopolysiloxane described above.

In the above-described formula (4), "m" is, for example, 0 to 0000, or preferably 0 to 1000 and "n" is, for example, 2 to 1000, or preferably 2 to 100.

In the above-described formula (5), "m" is, for example, 0 to 10000, or preferably 0 to 1000 and "n" is, for example, 0 to 1000, or preferably 0 to 100.

Examples of the second organopolysiloxane include a straight chain structure of dimethylhydrosilyl-terminated polydimethylsiloxane (corresponding to the above-described formula (5)), dimethylhydrosilyl-terminated dimethylsiloxane-diphenylsiloxane copolymer (corresponding to the above-described formula (5)), dimethylhydrosilyl-terminated polymethylphenylsiloxane (corresponding to the above-described formula (5)), dimethylhydrosilyl-terminated dimethylsiloxane-diethylsiloxane copolymer (corresponding to the above-described formula (5)), trimethylsiloxy-terminated dimethylsiloxane-methylhydrosiloxane copolymer (corresponding to the above-described formula (4)), and trimethylsiloxy-terminated polymethylhydrosiloxane (corresponding to the above-described formula (4)). The molecular structure of the second organopolysiloxane is not limited to the above-described straight chain structure and may be, for example, a cyclic chain structure, a branched chain structure, or a three dimensional network structure.

Of the second organopolysiloxanes, preferably an organopolysiloxane containing a hydrogen atom in its side chain represented by the above-described formula (4), or more preferably a trimethylsiloxy-terminated dimethylsiloxane-methylhydrosiloxane copolymer is used.

The second organopolysiloxanes can be used alone (one only) or in combination of two or more.

The content of the hydrosilyl group (the molarity of the hydrosilyl group per unit mass) in the second organopolysiloxane is, in view of hardness and flexibility of the cured product, for example, 0.005 to 10 mmol/g, or preferably 0.01 to 5 mmol/g.

When the content of the hydrosilyl group in the second organopolysiloxane is below 0.005 mmol/g, the hardness of the cured product may be insufficient. When the content of the hydrosilyl group exceeds 10 mmol/g, the flexibility of the cured product may be insufficient.

The number average molecular weight of the second organopolysiloxane is, for example, 1000 to 100000, or preferably 5000 to 50000.

The viscosity (at 25° C.) of the second organopolysiloxane is, in view of hardness of the cured product, for example, 100 to 500000 mPa·s, or preferably 300 to 100000 mPa·s. The viscosity of the second organopolysiloxane can be measured using a B-type viscometer.

The second organopolysiloxane is blended in 100 parts by mass of a silicone resin composition at a mixing ratio of, for example, 0.1 to 99.9 parts by mass, or preferably 1 to 99 parts by mass.

The second organopolysiloxane is, in view of hardness of the cured product, blended at a mixing ratio of, for example, 0.1 to 1000 parts by mass, preferably 1 to 100 parts by mass, more preferably 10 to 90 parts by mass, or even more preferably 20 to 50 parts by mass with respect to 100 parts by mass of the first organopolysiloxane.

In the silicone resin composition, the molar ratio of the ethylenically unsaturated hydrocarbon group in the first organopolysiloxane to the hydrosilyl group in the second organopolysiloxane (the ethylenically unsaturated hydrocarbon group/the hydrosilyl group) is, for example, 1/50 to 50/1, or preferably 1/5 to 5/1.

In the silicone resin composition, the molar ratio of the hydrosilyl group in the first organopolysiloxane to the hydrosilyl group in the second organopolysiloxane (the hydrosilyl group in the first organopolysiloxane/the hydrosilyl group in the second organopolysiloxane) is, for example, 1/100 to 50/1, or preferably 1/70 to 5/1.

Examples of the hydrosilylation catalyst include platinum catalysts such as platinum black, platinum chloride, chloroplatinic acid, a platinum olefin complex, a platinum carbonyl complex, and platinum acetyl acetate; palladium catalysts; and rhodium catalysts.

Of the hydrosilylation catalysts, in view of transparency of the cured product, compatibility with the silicone resin composition, and catalyst activity, preferably a platinum catalyst, more preferably a platinum olefin complex and a platinum carbonyl complex, to be specific, a platinum-1,3-divinyl-1,1,3,3-tetramethyldisiloxane complex is used.

The ethylenically unsaturated hydrocarbon group in the first organopolysiloxane and the hydrosilyl group in the second organopolysiloxane are subjected to a hydrosilylation reaction in the presence of the hydrosilylation catalyst.

The hydrosilylation catalyst may be prepared as a solution in a known solvent (such as toluene).

The hydrosilylation catalyst is blended into the silicone resin composition at a mixing ratio of, for example, $1.0 \times 10^{-4}$ to 0.5 parts by mass, or preferably $1.0 \times 10^{-3}$ to 0.5 parts by mass with respect to 100 parts by mass of the first organopolysiloxane.

The hydrosilylation catalyst is blended into the silicone resin composition at a mixing ratio of, for example, $1.0 \times 10^{-6}$ to $5.0 \times 10^{-3}$ mmol, or preferably $1.0 \times 10^{-5}$ to $5.0 \times 10^{-3}$ mmol with respect to 1 mmol/g, which is the content of the ethylenically unsaturated hydrocarbon group in the first organopolysiloxane in the silicone resin composition.

An example of the hydrosilylation inhibitor includes quaternary ammonium hydroxides including tetraalkyl ammonium hydroxides such as tetramethyl ammonium hydroxide, tetraethyl ammonium hydroxide, tetrapropyl ammonium hydroxide, tetrahexyl ammonium hydroxide, tetrabutyl ammonium hydroxide, and hexadecyltrimethyl ammonium hydroxide and trialkyl ammonium hydroxides such as benzyltrimethyl ammonium hydroxide.

The hydrosilylation inhibitors can be used alone (one only) or in combination of two or more.

Of the hydrosilylation inhibitors, preferably tetraalkyl ammonium hydroxide, more preferably tetraalkyl ammonium hydroxide containing an alkyl group having 1 to 4 carbon atoms, or even more preferably tetramethyl ammonium hydroxide is used.

The hydrosilylation inhibitor is, in view of catalyst activity and easy availability, preferably used as an aqueous solution or an alcohol solution and is, in view of transparency and handling ability of the cured product, preferably used as an alcohol solution.

The hydrosilylation inhibitor stabilizes the hydrosilylation catalyst and suppresses the hydrosilylation reaction of the ethylenically unsaturated hydrocarbon group with the hydrosilyl group. The hydrosilylation inhibitor also accelerates a condensation reaction of a silanol group produced by allowing the hydrosilyl group to react with water.

The hydrosilylation inhibitor is blended into the silicone resin composition at a mixing ratio of, for example, $1.0 \times 10^{2}$ to $1.0 \times 10^{6}$ parts by mass, or preferably $1.0 \times 10^{3}$ to $1.0 \times 10^{5}$ parts by mass with respect to 100 parts by mass of the hydrosilylation catalyst.

When the mixing ratio of the hydrosilylation inhibitor is below $1.0 \times 10^{2}$, a sufficient suppressing effect on curing may not be obtained. When the mixing ratio of the hydrosilylation inhibitor exceeds $1.0 \times 10^{6}$, there may be a case where it becomes difficult to cure the silicone resin composition or the heat resistance of the cured product is reduced.

A filler, as an optional element, can be added to the silicone resin composition as long as it does not damage the effect of the present invention.

Examples of the filler include inorganic fillers such as silica, titanium oxide, zirconium oxide, magnesium oxide, zinc oxide, iron oxide, aluminum hydroxide, calcium carbonate, layered mica, carbon black, diatomite, a glass fiber, and a phosphor (an oxide phosphor, a nitride phosphor, and an oxynitride phosphor activated by a lanthanoid element) and an organic silicon treatment filler where the inorganic filler is subjected to a surface treatment with an organic silicon compound such as organoalkoxysilane, organochlorosilane, or organosilazane.

The filler is blended into the silicone resin composition at a mixing ratio of, for example, 1 to 100 parts by mass, or preferably 1 to 50 parts by mass with respect to 100 parts by mass of the first organopolysiloxane.

An additive, as another optional element, may be added to the silicone resin composition at an appropriate ratio as long as it does not damage the effect of the present invention. Examples of the additives include antioxidants, modifiers, surfactants, dyes, pigments, discoloration inhibitors, ultraviolet absorbers, anti-crepe hardening agents, plasticizers, thixotrophy imparting agents, and fungicides.

To prepare the silicone resin composition, the first organopolysiloxane, the second organopolysiloxane, the hydrosilylation catalyst, the hydrosilylation inhibitor, and the above-described optional element such as a filler as required are blended at the above-described mixing ratio and are stirred to be mixed at, for example, 0 to 60° C. for, for example, 1 to 120 minutes.

According to the silicone resin composition, the first organopolysiloxane having, in one molecule, both at least two ethylenically unsaturated hydrocarbon groups and at least two hydrosilyl groups; the second organopolysiloxane having, in one molecule, at least two hydrosilyl groups without containing an ethylenically unsaturated hydrocarbon group; the hydrosilylation catalyst; and the hydrosilylation inhibitor are contained.

Therefore, it is possible to suppress the hydrosilylation reaction of the ethylenically unsaturated hydrocarbon group in the first organopolysiloxane with the hydrosilyl group in the second organopolysiloxane with the hydrosilylation inhibitor and to proceed the condensation reaction of the hydrosilyl group in the first organopolysiloxane with the hydrosilyl group in the second organopolysiloxane.

As a result, the silicone resin composition can be uniformly semi-cured.

In the silicone resin composition, the hydrosilylation inhibitor contains the quaternary ammonium hydroxide.

Therefore, the hydrosilylation inhibitor can accelerate the condensation reaction of the silanol group produced by allowing the hydrosilyl group to react with water, while stabilizing the hydrosilylation catalyst and suppressing the hydrosilylation reaction of the ethylenically unsaturaged hydrocarbon group with the hydrosilyl group.

As a result, the silicone resin composition can be semi-cured, while the hydrosilylation reaction of the ethylenically unsaturated hydrocarbon group with the hydrosilyl group is suppressed.

Next, a method for producing the silicone resin sheet of the present invention is described.

To produce the silicone resin sheet, the above-described silicone resin composition is first applied onto a substrate.

Examples of the substrate include a release sheet (for example, an organic polymer film such as PET) whose surface is subjected to a release treatment, a ceramic, and a metal board.

Examples of a method for applying the silicone resin composition onto the substrate include a casting, a spin coating, and a roll coating.

The silicone resin composition has a coating film thickness in the range of, for example, 0.1 to 100 mm, or preferably 0.1 to 5 mm.

Next, the silicone resin composition applied on the substrate is heated at, for example, 20 to 200° C., or preferably 40 to 150° C., for, for example, 0.1 to 120 minutes, or preferably 1 to 60 minutes.

In this way, the silicone resin composition applied on the substrate is brought into a semi-cured state (in a B-stage state), so that the silicone resin sheet is obtained.

The obtained silicone resin sheet has a thickness in the range of, for example, 100 to 10000 μm, or preferably 100 to 3000 μm.

The obtained silicone resin sheet has such hardness that the thickness thereof after being pressed at a pressure of 7 g/mm$^2$ is, for example, 0.1 to 10%, or preferably 0.1 to 5% with respect to that before being pressed. At this time (immediately after the fabrication), the percentage of the thickness of the silicone resin sheet after being pressed with respect to that before being pressed is defined as the sheet hardness immediately after the fabrication of the silicone resin sheet.

After the obtained silicone resin sheet is stored at 5° C. for 24 hours, the silicone resin sheet has such hardness that the thickness thereof after being pressed at a pressure of 7 g/mm$^2$ is, for example, 0.1 to 10%, or preferably 0.1 to 5% with respect to that before being pressed. At this time (after being stored at 5° C. for 24 hours), the percentage of the thickness of the silicone resin sheet after being pressed with respect to that before being pressed is defined as the sheet hardness after being stored.

The obtained silicone resin sheet has the percentage (the hardness retention rate) of the sheet hardness after being stored with respect to that immediately after the fabrication in the range of, for example, 100 to 200%, or preferably 100 to 150%.

The silicone resin sheet is obtained by semi-curing the silicone resin composition, so that a uniform semi-cured state thereof is achieved and therefore, the handling ability can be improved.

According to the silicone resin sheet, the hardness thereof is adjusted to have a predetermined hardness, so that the handling ability can further be improved.

The silicone resin sheet of the present invention can be effectively used as an encapsulating material, a filling material, or the like in various industrial fields. Above all, the silicone resin sheet of the present invention is preferably used as an encapsulating material of the optical semiconductor element device.

Next, an optical semiconductor element device 1 including an encapsulating layer 7 obtained by curing the obtained silicone resin sheet is described.

The optical semiconductor element device 1 includes a circuit board 2 and a light emitting diode 3 as an optical semiconductor element.

The circuit board 2 includes a base board 4 and a wiring pattern 5 that is formed on the upper surface thereof. An external electric power is supplied to the circuit board 2.

The base board 4 is formed into a generally rectangular flat plate shape in plane view and is formed of, for example, a metal material such as aluminum, a ceramic material such as alumina, or a resin material such as polyimide.

The wiring pattern 5 electrically connects a terminal of the light emitting diode 3 with a terminal (not shown) of a power source (not shown) for supplying electric power to the light emitting diode 3. The wiring pattern 5 is formed of, for example, a conductive material such as copper and iron.

The light emitting diode 3 is provided on the base board 4. The light emitting diode 3 is electrically connected to (wire-bonding mounted or flip-chip mounted on) the wiring pattern 5. The light emitting diode 3 emits light based on electric power from the circuit board 2.

The optical semiconductor element device 1 includes the encapsulating layer 7 that encapsulates the light emitting diode 3.

The encapsulating layer 7 is laminated at the upper side of the base board 4 so as to cover the light emitting diode 3.

To form the encapsulating layer 7, the obtained silicone resin sheet is first laminated on the base board 4 and is compressively bonded thereto, for example, using a laminator, at a temperature of, for example, 100 to 200° C., or preferably 120 to 180° C. at a pressure of, for example, 0.01 to 10 MPa, or preferably 0.1 to 1 MPa for, for example, 2 to 600 seconds.

Next, the silicone resin sheet that is compressively bonded onto the base board 4 is heated at, for example, 120 to 250° C., or preferably 150 to 200° C., for, for example, 0.5 to 48 hours, or preferably 1 to 24 hours.

In this way, the silicone resin sheet is cured to obtain the encapsulating layer 7.

According to the optical semiconductor element device 1, the encapsulating layer 7 is obtained by curing the silicone resin sheet, so that the light emitting diode 3 can be easily encapsulated.

EXAMPLES

While the present invention will hereinafter be described in further detail with reference to Examples and Comparative Examples, the present invention is not limited to these Examples and Comparative Examples.

1. Fabrication of Silicone Resin Sheet

Example 1

14.3 μL (0.013 mmol) of a methanol solution with a concentration of 10% tetramethylammonium hydroxide was added to 30 g of a hydrogen-terminated vinylmethylsiloxane-dimethylsiloxane copolymer (a vinyl group content of 0.079 mmol/g, a hydrosilyl group content of 0.04 mmol/g, a number average molecular weight of 47000, viscosity (at 25° C.) of 8100 mPa·s), and 1.00 g of an organohydrogen polysiloxane (trimethylsiloxy-terminated dimethylsiloxane-methylhydrosiloxane copolymer: a hydrorosilyl group content of 7.14 mmol/g, a number average molecular weight of 2000) and 1.9 μL it of a platinum carbonyl complex solution (a platinum concentration of 2 mass %) were added thereto.

The molar ratio of the vinyl group content in the hydrogen-terminated vinylmethylsiloxane-dimethylsiloxane copolymer to the hydrosilyl group content in the organohydrogen polysiloxane (the vinyl group/the hydrosilyl group) was 1/3.

The molar ratio of the hydrosilyl group content in the hydrogen-terminated vinylmethylsiloxane-dimethylsiloxane copolymer to the hydrosilyl group content in the organohydrogen polysiloxane (the hydrosilyl group content in the hydrogen-terminated vinylmethylsiloxane-dimethylsiloxane copolymer/the hydrosilyl group content in the organohydrogen polysiloxane) was 1/5.95.

Next, the obtained mixture was stirred to be mixed at 25° C. for 0.1 hours, so that a silicone resin composition was prepared.

The obtained silicone resin composition was applied onto a polyethylene terephthalate film (manufactured by Nippa CO., LTD, SS4C) with a coating film thickness of 600 μm and was heated at 80° C. for 3 to 10 minutes to semi-cure the silicone resin composition, so that a silicone resin sheet was fabricated.

Example 2

A silicone resin sheet was fabricated in the same manner as in the above-described Example 1, except that a hydrogen-terminated vinylmethylsiloxane-dimethylsiloxane copolymer (a vinyl group content of 0.13 mmol/g, a hydrosilyl group content of 0.04 mmol/g, a number average molecular weight of 48000, viscosity (at 25° C.) of 14000 mPa·s) was used instead of a hydrogen-terminated vinylmethylsiloxane-dimethylsiloxane copolymer (a vinyl group content of 0.079 mmol/g, a hydrosilyl group content of 0.04 mmol/g, a number average molecular weight of 47000, viscosity (at 25° C.) of 8100 mPa·s) and the mixing amount of an organohydrogen polysiloxane was 1.63 g.

Also in Example 2, the molar ratio of the vinyl group content in the hydrogen-terminated vinylmethylsiloxane-dimethylsiloxane copolymer to the hydrosilyl group content in the organohydrogen polysiloxane (the vinyl group/the hydrosilyl group) was 1/3.

The molar ratio of the hydrosilyl group content in the hydrogen-terminated vinylmethylsiloxane-dimethylsiloxane copolymer to the hydrosilyl group content in the organohydrogen polysiloxane (the hydrosilyl group content in the hydrogen-terminated vinylmethylsiloxane-dimethylsiloxane copolymer/the hydrosilyl group content in the organohydrogen polysiloxane) was 1/9.70.

Example 3

A silicone resin sheet was fabricated in the same manner as in the above-described Example 1, except that a hydrogen-terminated vinylmethylsiloxane-dimethylsiloxane copolymer (a vinyl group content of 0.84 mmol/g, a hydrosilyl group content of 0.037 mmol/g, a number average molecular weight of 61000, viscosity (at 25° C.) of 4500 mPa·s) was used instead of a hydrogen-terminated vinylmethylsiloxane-dimethylsiloxane copolymer (a vinyl group content of 0.079 mmol/g, a hydrosilyl group content of 0.04 mmol/g, a number average molecular weight of 47000, viscosity (at 25° C.) of 8100 mPa·s) and the mixing amount of an organohydrogen polysiloxane was 10.6 g.

Also in Example 3, the molar ratio of the vinyl group content in the hydrogen-terminated vinylmethylsiloxane-dimethylsiloxane copolymer to the hydrosilyl group content in the organohydrogen polysiloxane (the vinyl group/the hydrosilyl group) was 1/3.

The molar ratio of the hydrosilyl group content in the hydrogen-terminated vinylmethylsiloxane-dimethylsiloxane copolymer to the hydrosilyl group content in the organohydrogen polysiloxane (the hydrosilyl group content in the hydrogen-terminated vinylmethylsiloxane-dimethylsiloxane copolymer/the hydrosilyl group content in the organohydrogen polysiloxane) was 1/68.2.

Comparative Example 1

20 g (0.71 mmol) of a vinyl-terminated polydimethylsiloxane, 0.80 g of an organohydrogen polysiloxane (trimethylsiloxy-terminated dimethylsiloxane-methylhydrosiloxane copolymer: a hydrosilyl group content of 7.14 mmol/g, a number average molecular weight of 2000), 0.036 ml of a platinum carbonyl complex solution (a platinum concentration of 2 mass %), and 0.028 ml (0.081 mmol) of a 1,3,5,7-tetravinyl-1,3,5,7-tetramethylcyclotetrasiloxane were blended, and the mixture was stirred to be mixed at room temperature (20° C.) for 10 minutes, so that a silicone resin composition was prepared.

The obtained silicone resin composition was applied onto a biaxially-oriented polyester film (manufactured by Mitsubishi Chemical Polyester Film Corporation, 50 μm) with a coating film thickness of 500 μm and was heated at 80° C. for 6 minutes to semi-cure the silicone resin composition, so that a silicone resin sheet was fabricated.

Comparative Example 2

A silicone resin composition was prepared in the same manner as in Example 1, except that a tetramethylammonium hydroxide was not blended.

When the obtained silicone resin composition was applied onto a polyethylene terephthalate film (manufactured by Nippa CO., LTD, SS4C) with a coating film thickness of 600 μm and was heated at 135° C. for 5 minutes, the silicone resin composition was not cured.

When the obtained silicone resin composition was heated at 200° C. for 5 minutes, the inside of the silicone resin composition remained in a liquid state and the surface thereof only was cured.

In Comparative Example 2, a silicone resin sheet in a semi-cured state could not be fabricated.

2. Evaluation

The following evaluation was performed on the silicone resin sheets obtained in Examples and Comparative Example.

(1) Hardness Test

Each of the silicone resin sheets in Examples and Comparative Example immediately after the fabrication was pressed toward a thickness direction thereof at a pressure of 7 g/mm$^2$ with a sensor head using a digital length measuring meter (MS-5C, manufactured by Nikon Corporation).

The distance that the sensor head sank from a surface of the silicone resin sheet toward the downstream side in a pressure direction was measured to calculate the percentage of the thickness of a pressed portion in the silicone resin sheet after being pressed with respect to that before being pressed by the following equation. The obtained value was defined as a sheet hardness. The results are shown in Table 1.

Sheet hardness=[1−{the distance (μm) the sensor head sank/the thickness (μm) of the silicone resin sheet before being pressed}]×100

The larger value of the sheet hardness shows that the silicone resin sheet is harder.

(2) Storage Stability Test

Each of the silicone resin sheets in Examples and Comparative Example was stored at 5° C. for 24 hours and the sheet hardness thereof was calculated in the same manner as in the above-described hardness test.

The percentage of the sheet hardness of the silicone resin sheet after the storage with respect to that immediately after the fabrication was calculated. The obtained value was defined as the hardness retention. The results are shown in Table 1.

The value of the hardness retention closer to 100% shows the more excellent storage stability of the silicone resin sheet.

(3) State Evaluation of Silicone Resin sheet

In each of the silicone resin sheets in Examples and Comparative Example, it was confirmed whether or not a liquid component (an unreacted component) was left visually and tactually to be determined in accordance with the following evaluation criteria. The results are shown in Table 1.

Good: Liquid component was not left.
Bad: Liquid component was left.

TABLE 1

| | Example 1 | Example 2 | Example 3 | Comparative Example 1 | Comparative Example 2 |
|---|---|---|---|---|---|
| Hardness Immediately After Preparation | 4.2 | 1.5 | 2.0 | 1.5 | — |
| Hardness After Storage | 4.6 | 2.0 | 2.4 | 9.0 | — |
| Hardness Retention | 110 | 133 | 120 | 600 | — |
| Sheet State Evaluation | Good | Good | Good | Bad | — |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A silicone resin composition comprising:
   a first organopolysiloxane having, in one molecule, both at least two ethylenically unsaturated hydrocarbon groups and at least two hydrosilyl groups;
   a second organopolysiloxane having, in one molecule, at least two hydrosilyl groups without containing an ethylenically unsaturated hydrocarbon group;
   a hydrosilylation catalyst; and
   a hydrosilylation inhibitor containing a quaternary ammonium hydroxide.

2. A silicone resin sheet obtained by semi-curing a silicone resin composition, containing
   a first organopolysiloxane having, in one molecule, both at least two ethylenically unsaturated hydrocarbon groups and at least two hydrosilyl groups;
   a second organopolysiloxane having, in one molecule, at least two hydrosilyl groups without containing an ethylenically unsaturated hydrocarbon group;
   a hydrosilylation catalyst; and
   a hydrosilylation inhibitor containing a quaternary ammonium hydroxide.

3. The silicone resin sheet according to claim 2, wherein the thickness of the silicone resin sheet after being pressed at a pressure of 7 $g/mm^2$ and determined according to a hardness test is 0.1 to 10% with respect to that before being pressed,
   the hardness test comprising: pressing the silicone resin sheet immediately after fabrication toward a thickness direction thereof at a pressure of 7 $g/mm^2$ with a sensor head using a digital length measuring meter; and measuring a distance that the sensor head sank from a surface of the silicone resin sheet toward a down streamside in a pressure direction to calculate a percentage of the thickness of a pressed portion in the silicone resin sheet after being pressed with respect to that before being pressed.

4. An optical semiconductor element device comprising:
   an optical semiconductor element and
   an encapsulating layer encapsulating the optical semiconductor element that is obtained by curing a silicone resin sheet, obtained by semi-curing a silicone resin composition, containing
   a first organopolysiloxane having, in one molecule, both at least two ethylenically unsaturated hydrocarbon groups and at least two hydrosilyl groups;
   a second organopolysiloxane having, in one molecule, at least two hydrosilyl groups without containing an ethylenically unsaturated hydrocarbon group;
   a hydrosilylation catalyst; and
   a hydrosilylation inhibitor containing a quaternary ammonium hydroxide.

5. A method for producing a silicone resin sheet comprising the steps of:
   applying a silicone resin composition, containing
   a first organopolysiloxane having, in one molecule, both at least two ethylenically unsaturated hydrocarbon groups and at least two hydrosilyl groups;
   a second organopolysiloxane having, in one molecule, at least two hydrosilyl groups without containing an ethylenically unsaturated hydrocarbon group;
   a hydrosilylation catalyst; and
   a hydrosilylation inhibitor containing a quaternary ammonium hydroxide, onto a substrate and
   heating the silicone resin composition applied on the substrate at 20 to 200° C. for 0.1 to 120 minutes.

* * * * *

UNITED STATES PATENT AND TRADEMARK OFFICE
CERTIFICATE OF CORRECTION

| | | |
|---|---|---|
| PATENT NO. | : 8,575,290 B2 | Page 1 of 1 |
| APPLICATION NO. | : 13/469452 | |
| DATED | : November 5, 2013 | |
| INVENTOR(S) | : Munehisa Mitani, Hiroyuki Katayama and Haruka Fujii | |

It is certified that error appears in the above-identified patent and that said Letters Patent is hereby corrected as shown below:

In the Specification

At column 7, lines 37-40, please amend the reference to formula (4) to be formula (5) as follows:

Formula [[(4)]](5):

Chemical Formula [[4]] 5

Signed and Sealed this
Twenty-second Day of April, 2014

Michelle K. Lee
*Deputy Director of the United States Patent and Trademark Office*